July 23, 1963 F. BREGMAN 3,098,938
PULSE AMPLITUDE DISCRIMINATOR
Filed May 10, 1961
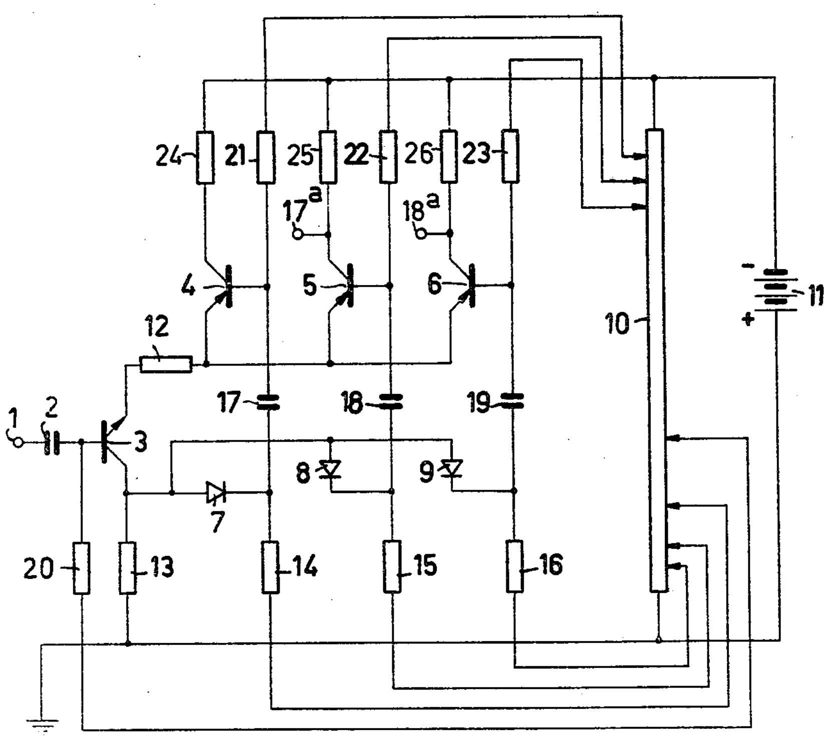
INVENTOR
FRANK BREGMAN.
BY Frank R. Jufani
AGENT United States Patent Office 3,098,938

Patented July 23, 1963

3,098,938

PULSE AMPLITUDE DISCRIMINATOR

Frank Bregman, Emmasingel, Eindhoven, Netherlands, assignor to North American Philips Company, Inc., New York, N.Y., a corporation of Delaware Filed May 10, 1961, Ser. No. 109,163
Claims priority, application Netherlands May 11, 1960
4 Claims. (Cl. 307—88.5)

This invention relates to pulse amplitude discriminator circuits and more particularly to transistor pulse amplitude discriminator circuits.

In one type of pulse amplitude discriminator circuit of the prior art, two Schmitt trigger circuits are utilized in conjunction with an anti-coincidence circuit to determine whether the amplitude of a pulse signal applied thereto lies between the upper and lower limiting values of a given amplitude spectrum. Transistors are frequently part of the constituent elements of this type of discriminator.

An object of this invention is to provide a simplified pulse amplitude transistor discriminator circuit.

Another object of this invention is to provide a simplified pulse amplitude transistor discriminator circuit which obviates the requirement of additional circuitry, such as, for example, the aforementioned anti-coincidence circuit of the above-described prior art devices.

Accordingly, this invention features a discriminator circuit for a given amplitude spectrum having first and second limits, comprising an input transistor of a given conductivity type whose emitter is connected, via a common emitter resistor, to each of the emitter electrodes of a plurality of opposite conductivity type transistors. A source of voltage, which has suitable terminals of relatively opposite polarity, is compatibly coupled, via respective collector resistors, to the collectors of the transistors of both types. The base electrodes of the opposite conductivity type transistors are coupled to the collector electrode of the input transistor, via respective coupling means, each of which comprises a series connected capacitor and rectifier means. The input pulse signal is applied to the input means associated with the input transistor. By provision of suitable bias means, one of the opposite conductivity type transistors is in mutually exclusive series conduction with the input transistor at amplitudes of the pulse signal less than the first limit of the given spectrum. The remaining transistors are associated with different predetermined bands of the given amplitude spectrum which, by virtue of the circuit bias means places the relevant remaining opposite conductivity type transistor in mutually exclusive series conduction with the input transistor for amplitudes of the pulse signal within the band associated therewith. The provided bias means also cuts off all of the transistors of both types for amplitudes above the given amplitude spectrum. A minimum of two opposite conductivity type transistors may be provided in which case the band associated with the relevant transistor may be made substantially equal to the given spectrum to be analyzed. As additional opposite conductivity type transistors are included, the spectrum may be broken into a number of channels, with each channel or band being allocated to one of the opposite conductivity type transistors.

The above mentioned and other features and objects of this invention will become more apparent by reference to the following description taken in conjunction with the accompanying drawing, in which:

The figure is a schematic diagram of an embodiment of the pulse amplitude discriminator circuit of this invention.

The embodiment of the figure describes an arrangement of the transistors compatible to the conductivity types chosen to illustrate the input and the other transistors and is intended to be by way of example only, it being apparent to one skilled in the art, other modifications in the circuit of the figure may be accomplished which would allow, for example, interchangement of the types of transistors and/or reversal of the polarity of the input signal, etc., without departing from the scope of this invention.

Referring to the figure, a pulse amplitude discriminator circuit according to the invention comprises an input transistor 3 of a given conductivity type, illustrated, for example, as being of the NPN type. The pulse signal whose amplitudes are to be analyzed is applied to input means, illustrated as terminal 1 and series-connected coupling capacitor 2, associated with transistor 3, via the base electrode thereof. A plurality of opposite conductivity type transistors, which, for the example chosen for input transistor 3, are illustrated as being three PNP type transistors 4, 5 and 6, have their respective emitter electrodes serially coupled, via a common emitter resistor 12, to the emitter electrode of transistor 3. It is to be understood, however, that the number of opposite conductivity type transistors, illustrated in the figure as being three, is by way of example only, and that two or more such type transistors and associated circuitry thereof may be utilized in practicing the principles of this invention as will become more apparent hereinafter.

Collector resistors 13, 24, 25, 26 are connected, respectively, to the collector electrodes of their respective transistors 3, 4, 5, 6, and a source of supply voltage, illustrated as battery 11, having a pair of relatively opposite polarity terminals which are compatibly coupled to these collector electrodes, via their respective collector resistors. To couple the base electrodes of the three transistors 4, 5, 6 to the collector electrode of input transistor 3, respective coupling means are provided, each of which comprises a serially connected capacitor 17, 18, or 19 and rectifier means illustrated, by way of example, as being respective diodes 7, 8, or 9. Bias means adapted to provide mutually exclusive series conduction between said input transistor and one of said opposite conductivity type transistors, as will be explained hereinafter, is shown, for example, as comprising a potentiometer 10 shunted across the battery 11 and connected to several bias resistors 14, 15, 16 and 20, 21, 22, 23 which bias, respectively, the respective diodes 7, 8, 9 and base electrodes of transistors 3, 4, 5, 6 at different potential levels.

The invention operates as follows:

By judicious selection of the adjustment of the bias means a given amplitude spectrum having first and second limits may be analyzed. In the quiescent condition transistors 3 and 4 are in mutually exclusive series conduction and the transistors 5, 6 and diodes 7, 8, 9 are cut off. Because of the bias adjustments the circuit of FIG. 1 remains in this condition when a pulse signal is applied to terminal 1 with an amplitude less than the first limit $V_1$ of the amplitude spectrum. The transistor 3 operates on the linear part of its characteristic through the entire ampltiude range of the pulses. As soon as the base of the transistor 3 receives a pulse higher than $V_1$ but lower than a second limit $V_2$, rectifier 7 becomes conductive and the positive collector signal from transistor 3 becomes operative, via the diode 7 and the capacitor 17 at the base of transistor 4 and starts a cumulative trigger action as a consequence of which transistor 4 is cut off and also transistor 3 is made somewhat less conductive. As long as the transistor 5 and the diode 7 do not pass current, the current variations in transistors 3 and 4 occur as in a normal amplifier. However, as soon as the diode 7 passes current these variations are cumulative (regeneartive) and as soon as transistor 5 passes current the current variations in transistors 3 and 5 occur in the normal way. Consequently the bias established by the bias means provides for mutually exclusive series conduction between one of the remaining opposite conductivity type transistor 5 or 6, whenever the amplitude of the pulse signal is within the given amplitude spectrum, and the particular transistor 5 or 6 that is placed in the mutually exclusive series conduction is dependent on the relative amplitude level of the pulse signal. The transistor 5 will be placed in temporary conduction, for example, if an input pulse occurs having an amplitude between $V_1$ and $V_2$; whereas transistor 6 will be placed in temporary conduction if the input pulse has an amplitude between $V_2$ and the second, i.e., upper, limit $V_3$. For amplitudes greater than the second limit $V_3$ of the given spectrum, all the transistors 3, 4, 5 and 6 are driven to cut-off, by virtue, again, of the bias established by the bias means.

As the circuits are monostable they will return to the rest position sometime after the pulse has disappeared.

Thus, each of the aforementioned remaining opposite conductivity type transistors are associated with a different band of the given amplitude spectrum, the latter being allocated, for example, into a number of channels equal to the number of aforementioned remaining transistors that are provided. For example, in cases where only two opposite conductivity type transistors are provided, the number of aforementioned remaining transistors will be equal to one, and, if desired, this one transistor may be associated with a band substantially equal to the given spectrum. For the example illustrated in the FIGURE, the number of remaining transistors is two, viz., transistors 5 and 6, and if desired, the transistor 5 may be associated with a first band that has a lower limit equal to the first limit of the given amplitude spectrum and the transistor 6 may be associated with a second band that has an upper limit equal to the second limit of the given amplitude spectrum. Thus, it can readily be seen that the spectrum may be divided into several channels by the addition of one or more additional opposite conductivity type transistors with their respective associated bias and coupling circuitry. Suitable output voltages associated with each of the opposite conductivity type transistors are derived from a terminal such as, for example, the terminal 17ª, or 18ª, and any other further terminals that may be provided. All pulses higher than $V_1$ appear at the terminal 17ª, whereas pulses higher than $V_2$ appear at the terminal 18ª etc.

Examining the operation of the circuit of the FIGURE in greater detail, it will be assumed that the amplitude spectrum has first and second limits, $V_1$ and $V_3$, respectively, to be analyzed. In such a case, the band associated with transistor 5 would have a lower limit $V_1$ and an upper limit, for example $V_2$, whereas the band associated with transistor 6 would have a lower limit, for example, $V_2$, and an upper limit $V_3$.

A negative pulse signal having a magnitude between the two limits $V_1$ and $V_2$ is assumed to be applied to the terminal 1. The negative pulse signal so applied is coupled to the base of transistor 3, via coupling capacitor 2, and commences to limit the conduction of transistor 3 towards a predetermined level. The negative voltage at the collector of transistor 3 becomes mor positive, which in turn places the plate, not shown, of diode 7 more positive with respect to the cathode, not shown, of diode 7 causing conduction therein. However, the other diodes 8, 9 are so biased that their respective plates remain negative with respect to their associated cathodes. Thus, the output voltage from the transistor 3 is coupled to the base emitter input of the transistor 4, via capacitor 17, which begins to limit the conduction of transistor 4 by causing the base of transistor 4 to become more positive with respect to its emitter. Simultaneously, the transistor 5 has its emitter driven more positive with respect to its base and conduction commences in the emitter collector circuit thereof. However, the transistor 6, because of the bias established, remains at cut-off. The cycle continues until transistor 4 is cut off and transistor 5 is in its respective mutually exclusive series conduction with transistor 3. In this manner, an output signal appears at the terminal 17ª whenever the amplitude of the input signal applied to terminal 1 lies between the two limits $V_1$ and $V_2$.

If a negative pulse signal having an amplitude whose magnitude is between $V_2$ and the higher limiting value $V_3$ is applied to terminal 1, the cycle is extended in a similar manner, so that transistors 4 and 5 will be at cut-off and transistor 6 will be in its respective mutually exclusive series conduction with transistor 3. In this manner, a negative input pulse appearing at the terminal 1 with an amplitude between the values $V_2$ and $V_3$, causes an output pulse to appear, for example, at the terminal 18ª.

As aforementioned, if a pulse signal having an amplitude in excess of the second limit $V_3$ is applied to the terminal 1, the transistors 3, 4, 5 and 6 are cut off. For amplitudes less than the first limit, $V_1$, the transistors 3, 4 are maintained in their quiescent mutually exclusive series conduction.

Thus, while I have described above the principles of my invention in connection with specific apparatus, it is to be clearly understood that this description is made only by way of example and not as a limitation to the scope of my invention as set forth in the objects thereof and in the accompanying claims.

I claim:

1. A pulse amplitude discriminator circuit for a given amplitude spectrum having first and second limits comprising an input transistor of a given conductivity type having input means associated therewith for the application of a pulse signal, a plurality of opposite conductivity type transistors, said transistors of both types each having respective emitter, base and collector electrodes, a common emitter resistor to connect serially the emitter electrode of said input transistor to the emitter electrode of each of said plurality of transistors, respective collector resistors connected to the collector electrode of each of said transistors of both types, a source of supply voltage having at least a pair of relatively opposite polarity terminals compatibly coupled to said collector resistors, respective means to couple the base electrodes of said plurality of transistors to the collector electrode of said input transistor, each of said respective means to couple comprising serially connected capacitor and rectifier means, and bias means adapted to provide mutually exclusive series conduction, respectively, between said input transistor and a predetermined opposite conductivity type transistor for amplitudes of said signal below said second limit, a first one of said opposite conductivity type transistors being in said mutually exclusive series conduction with said input transistor at amplitudes of said pulse signal less than said first limit, the remaining said opposite conductivity type transistors being in a respective said mutually exclusive series conduction with said input transistor at amplitudes of said pulse signal within different bands of said amplitude spectrum, and all of said transistors of both types being cut off at amplitudes of said pulse signal greater than said second limit.

2. A pulse amplitude discriminator according to claim 1 wherein said plurality of transistors comprises three said opposite conductivity type transistors, one of said three transistors comprising said first one transistor, two of said three transistors comprising said remaining transistors, the two said remaining transistors being in a said respective mutually exclusive series conduction with said input transistor at amplitudes of said pulse signal within two respective different bands of said amplitude spectrum, one of said two respective bands having a lower limit equal to the first limit of said spectrum, and the other of said two bands having an upper limit equal to the second limit of said spectrum.

3. A pulse amplitude discriminator circuit according to claim 1 wherein each of said rectifier means comprises a diode, said bias means further providing conduction of each of said diodes for amplitudes of said pulse signal above the relative band associated with the respective transistor thereof.

4. A pulse amplitude discriminator circuit for a given amplitude spectrum having first and second limits comprising an input transistor of a given conductivity type having input means associated therewith for the application of a pulse signal, a pair of transistors of a conductivity type opposite to that of said input transistor, said transistors of both types each having respective emitter, base and collector electrodes, a common emitter resistor to connect serially the emitter electrode of said input transistor to the emitter electrode of each of said pair of transistors, respective collector resistors connected to the collector electrode of each of said transistors of both types, a source of supply voltage having at least a pair of relatively opposite polarity terminals compatibly coupled to said collector resistors, respective means to couple the base electrodes of said pair of transistors to the collector electrode of said input transistor, each of said respective means to couple comprising serially connected capacitor and rectifier means, and bias means coupled to said transistors of both types and to said means to couple for providing simultaneous and mutually exclusive series conduction, respectively, between said input transistor and a predetermined one of said opposite conductivity type transistors for amplitudes of said signal below said second limit, said input transistor and a first one of said pair of transistors being simultaneously conductive to the exclusion of the second of said pair of transistors at amplitudes of said pulse signal less than said first limit, said input transistor and the second of said pair of transistors being simultaneously conductive to the exclusion of the first of said pair of transistors at amplitudes of said pulse signal within a band substantially equal to said amplitude spectrum, and all of said transistors of both types being in a cut-off condition at amplitudes of said pulse signal greater than said second limit.

References Cited in the file of this patent

UNITED STATES PATENTS 2,775,698 Bell et al. ------------- Dec. 25, 1956
2,853,633 McVey --------------- Sept. 23, 1958